United States Patent [19]

González et al.

[11] Patent Number: 5,244,826
[45] Date of Patent: Sep. 14, 1993

[54] METHOD OF FORMING AN ARRAY OF FINNED MEMORY CELL CAPACITORS ON A SEMICONDUCTOR SUBSTRATE

[75] Inventors: Fernando González; Roger R. Lee, both of Boise, Id.

[73] Assignee: Micron Technology, Inc., Boise, Id.

[21] Appl. No.: 870,606

[22] Filed: Apr. 16, 1992

[51] Int. Cl.$^5$ .............................................. H01L 21/76
[52] U.S. Cl. ................................. 437/60; 437/915; 437/919; 437/978
[58] Field of Search .............. 437/44, 52, 60, 192, 437/915, 919, 977, 978, 983; 148/DIG. 14, DIG. 138

[56] References Cited

U.S. PATENT DOCUMENTS

| | | | |
|---|---|---|---|
| 5,116,776 | 5/1992 | Chan et al. | 437/60 |
| 5,120,674 | 6/1992 | Chin et al. | 437/919 |
| 5,155,056 | 10/1992 | Jeong-Gyoo | 437/919 |
| 5,168,076 | 12/1992 | Godinho et al. | 437/60 |

FOREIGN PATENT DOCUMENTS 4074457 3/1992 Japan ..................................... 437/60

Primary Examiner—Brian E. Hearn
Assistant Examiner—C. Chaudhari
Attorney, Agent, or Firm—Wells, St. John, Roberts, Gregory & Matkin

[57] ABSTRACT

An array of finned memory cell capacitors on a semiconductor substrate includes: a) an array of electrically insulated word lines atop a semiconductor substrate; b) first and second active regions adjacent the word lines; c) capacitor storage nodes electrically connecting with the first active regions, individual capacitor storage nodes including: i) a layer of first conductive material conductively connecting with a first active region, the layer of first conductive material having opposed outer lateral edges, and ii) a layer of conductively doped storage node polysilicon overlying and conductively connecting with the layer of first conductive material, the storage node polysilicon projecting laterally outward beyond the outer lateral edges of the first conductive material to define opposing storage node capacitor fins projecting laterally above adjacent word lines; d) a layer of capacitor dielectric electrically connecting with the storage node capacitor fins; e) a layer of electrically conductive cell polysilicon electrically connecting with the capacitor dielectric layer; and f) bit lines electrically connecting with the second active regions. The invention also includes a method of forming memory cell capacitors.

20 Claims, 6 Drawing Sheets

METHOD OF FORMING AN ARRAY OF FINNED MEMORY CELL CAPACITORS ON A SEMICONDUCTOR SUBSTRATE

TECHNICAL FIELD

This invention relates generally to the fabrication of three dimensional stacked capacitors, and to three dimensional stacked capacitor constructions.

BACKGROUND OF THE INVENTION

As DRAMs increase in memory cell density, there is a continuous challenge to maintain sufficiently high storage capacitance despite decreasing cell area. Additionally, there is a continuing goal to further decrease cell area. A principal way of increasing cell capacitance is through cell structure techniques. Such techniques include three dimensional cell capacitors, such as trenched or stacked capacitors. This invention concerns stacked capacitor cell constructions.

With the conventional stacked capacitor, the capacitor is formed immediately above and electrically connected to the active device area of the associated MOS transistor of the memory cell. Problems associated with the prior art are described with reference to FIGS. 1-3. FIG. 1 illustrates a semiconductor wafer fragment 10 comprised of a bulk substrate 12, a pair of adjacent word lines 14, 16, and field oxide region 18. The illustrated region between word lines 14 and 16 will be utilized for formation of a stacked capacitor construction. The area to the left of word line 14, will be utilized for a bit line contact.

Substrate 12 is comprised of a p-type material having a p-type dopant concentration of approximately $2 \times 10^{15}$ atoms/cm$^3$, with the intent being to form n-channel transistors utilizing word lines 14 and 16. Such word lines are comprised of a conventional construction of gate oxide 20, conductively doped polysilicon 22, a more highly conductive silicide layer 24, and an overlying insulating oxide cap 26. Pairs 28, 30 of anisotropically etched side wall spacers are provided about outer edges of word lines 14 and 16. Such function to insulate the sides of word lines 14 and 16, and in the course of processing provide desired spacing for formation of LDD regions. Yet, only one pair of side wall spacers would be needed to insulate about the word lines. The extra side wall spacer is provided to facilitate formation of the desired LDD construction for proper circuit operation.

More specifically and prior to any spacer formation, a p-type LDD halo implant at a dose of approximately $4 \times 10^{12}$ atoms/cm$^2$ is provided into bulk substrate 22 to provide halo regions 32. Such constitute a part of an LDD construction. Thereafter, a layer of insulating material, typically SiO$_2$, is deposited atop the wafer and anisotropically etched to form spacer pairs 28. Thereafter, an n-type LDD implant is conducted at a typical dose of $1.5 \times 10^{13}$ atoms/cm$^2$ to produce regions 34, as shown. Such constitute a further aspect of an LDD construction, as is known by people of skill in the art. Thereafter, another layer of insulating material, such as SiO$_2$, is deposited and anisotropically etched to produce spacer pairs 30. Thereafter, a heavy n+ implant, typically at a dose of $8 \times 10^{15}$ atoms/cm$^2$, is provided to form high concentration n+ regions 36. Such regions 36 will be utilized to connect with bit lines and for capacitor formation. The process typically next continues by depositing and planarizing a layer 38 of insulating material.

Note that the immediately described technique requires added spacing between adjacent word lines 14 and 16 as a result of space being consumed by extra spacer regions 30 between each pair of word lines.

Referring to FIG. 2, insulating layer 38 is typically patterned and etched to produce a contact opening 40 which extends downwardly to active region 36 between word lines 14 and 16 for ultimate formation of a capacitor construction.

Referring to FIG. 3, next a layer 42 of polysilicon is deposited and patterned as illustrated to define isolated capacitor storage nodes. Polysilicon layer 42 is doped with an electrically conductive enhancing impurity to render such region electrically conductive. During such doping, a problem exists in preventing the doping impurity from migrating downwardly into the illustrated active region 36. Thereafter, a thin capacitor dielectric layer 44, followed by a thicker capacitor cell polysilicon layer 46, is deposited to complete construction of the capacitor.

It would be desirable to improve upon these and other aspects of three dimensional stacked capacitor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
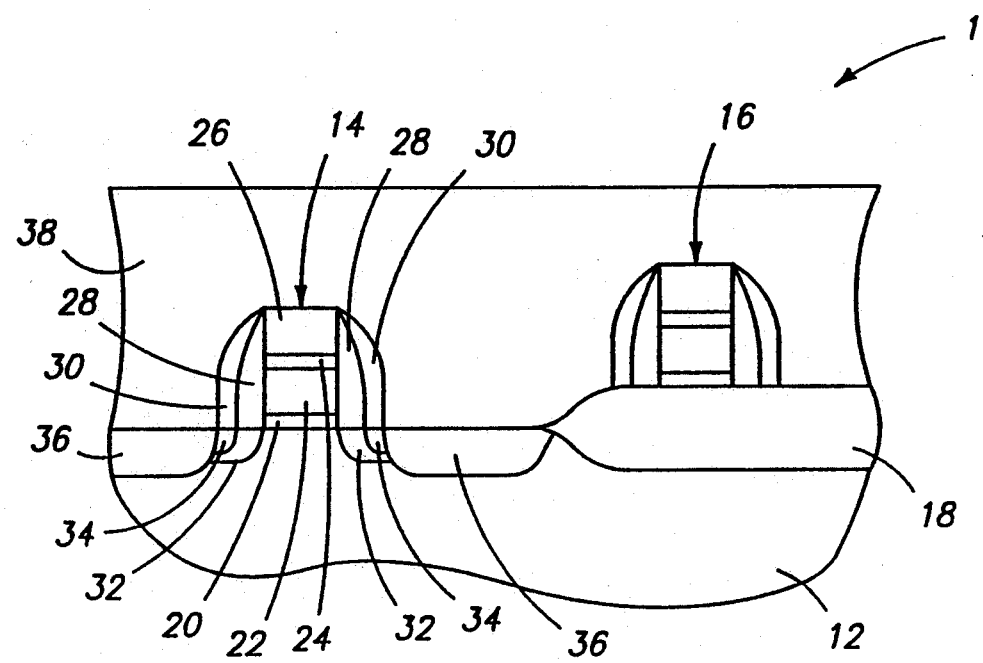
FIG. 1 is a sectional view of a prior art wafer fragment at one processing step in accordance with prior art methods, and is discussed in the "Background" section above.
Figure 2:
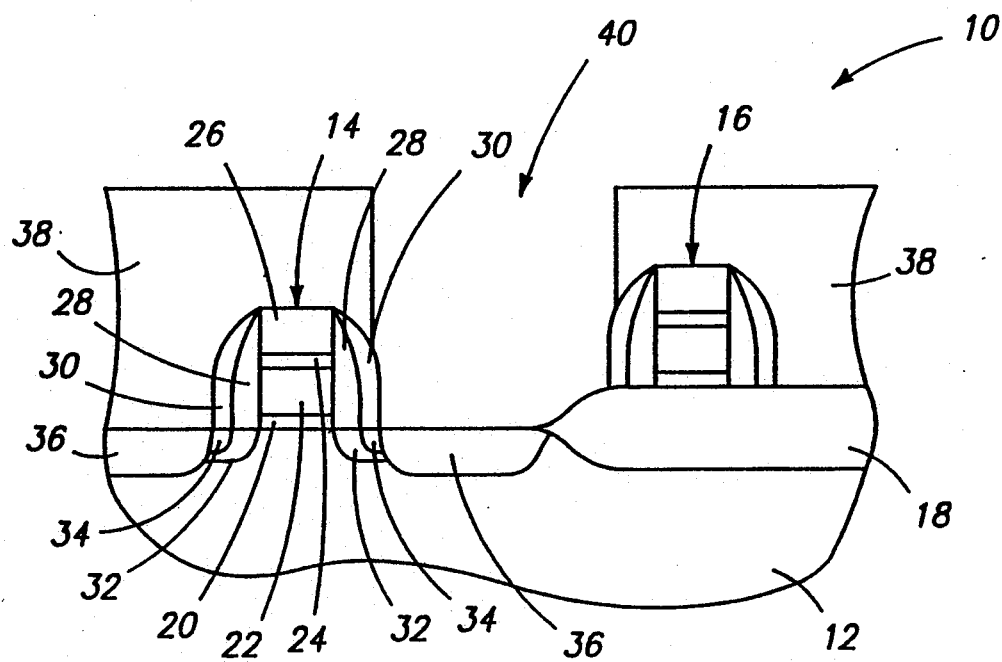
FIG. 2 is a view of the FIG. 1 wafer at a prior art processing step subsequent to that illustrated by FIG. 1.
Figure 3:
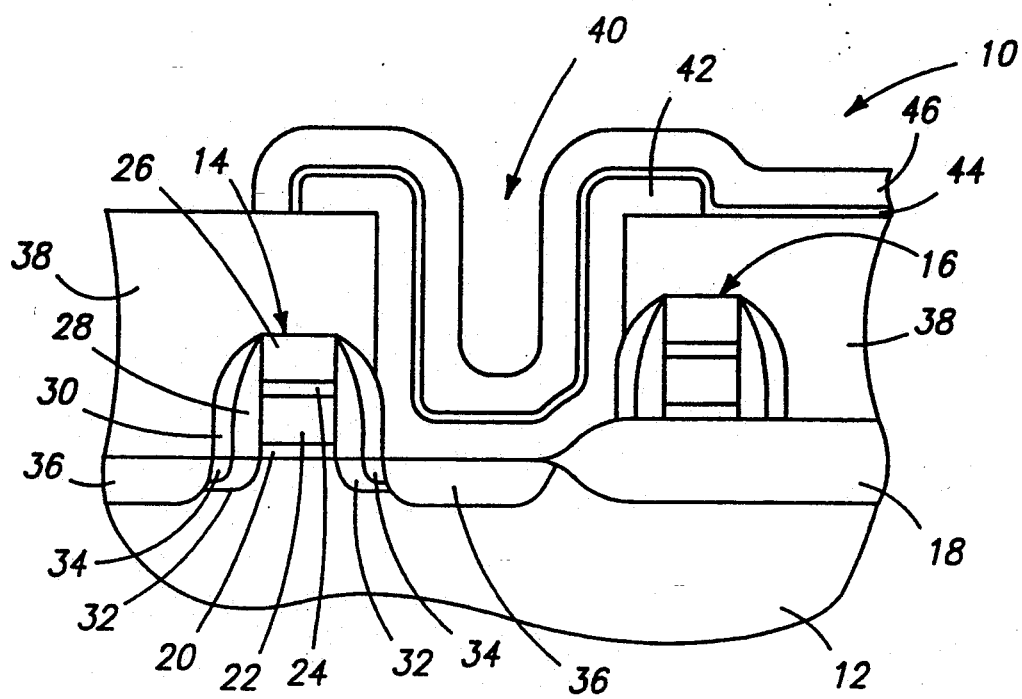
FIG. 3 is a view of the FIG. 1 wafer at a prior art processing step subsequent to that illustrated by FIG. 2.

This disclosure of the invention is submitted in furtherance of the constitutional purposes of the U.S. Patent Laws "to promote the progress of science and useful arts" (Article 1, Section 8).

In accordance with one aspect of the invention, a method of forming finned memory cell capacitors comprises the following steps:

providing an array of electrically insulated word lines atop a semiconductor wafer;

defining first active regions adjacent the word lines for connection with memory cell capacitors;

defining second active regions adjacent the word lines for electrical connection with bit lines;

etching to upwardly expose the first active regions;

providing a layer of first conductive material atop the wafer to a thickness of at least about 1500 Angstroms to conductively connect with the first active regions, the first conductive material being selectively etchable relative to silicon with silicon being selectively etchable relative to the first conductive material;

depositing a layer of storage node polysilicon atop the layer of first conductive material;

conductively doping storage node polysilicon with a conductivity enhancing impurity to conductively connect the storage node polysilicon with the layer of first conductive material, the layer of first conductive material during such doping acting as a diffusion barrier to prevent migration of the impurity into the first active regions;

etching the storage node polysilicon layer selectively relative to the first conductive material to define isolated capacitor storage nodes;

selectively undercut etching the layer of first conductive material selectively relative to the storage node polysilicon to expose bottom portions of the storage nodes above the electrically insulated word lines and thereby define capacitor fins;

conformally depositing a layer of capacitor dielectric atop the finned isolated capacitor storage nodes; and providing a layer of electrically conductive cell polysilicon atop the capacitor dielectric layer.

In accordance with another aspect of the invention, an array of finned memory cell capacitors on a semiconductor substrate comprises:

an array of electrically insulated word lines atop a semiconductor substrate;

first and second active regions adjacent the word lines;

capacitor storage nodes electrically connecting with the first active regions, individual capacitor storage nodes comprising:

a layer of first conductive material conductively connecting with a first active region, the layer of first conductive material having opposed outer lateral edges;

a layer of conductively doped storage node polysilicon overlying and conductively connecting with the layer of first conductive material, the storage node polysilicon projecting laterally outward beyond the outer lateral edges of the first conductive material to define opposing storage node capacitor fins projecting laterally above adjacent word lines;

a layer of capacitor dielectric electrically connecting with the storage node capacitor fins;

a layer of electrically conductive cell polysilicon electrically connecting with the capacitor dielectric layer; and bit lines electrically connecting with the second active regions.

Figure 4:
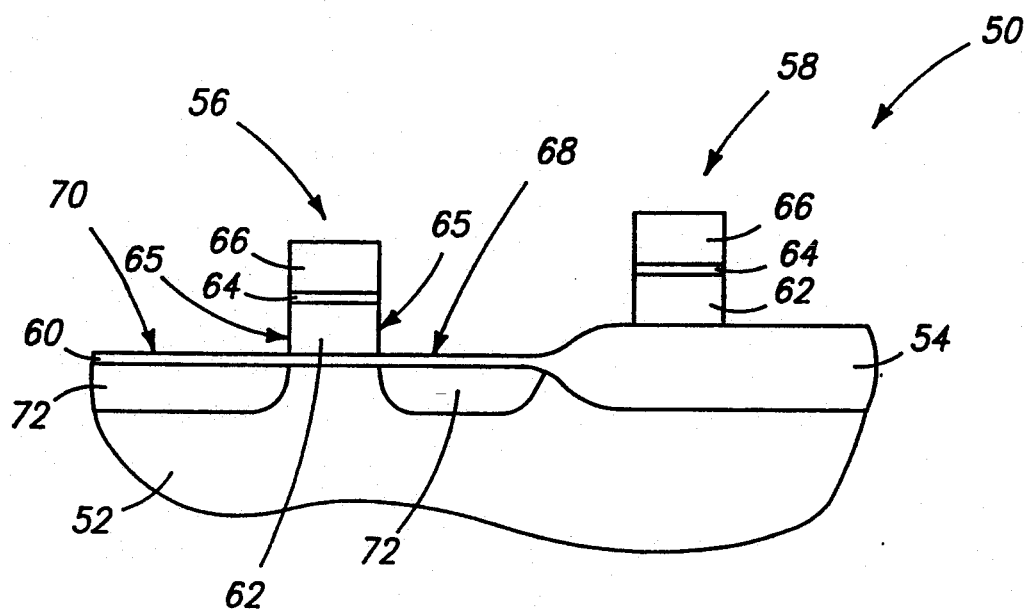
FIG. 4 is a diagrammatic sectional view of a semiconductor wafer at one processing step in accordance with the invention.

More particularly and with reference to FIGS. 4–12, a semiconductor wafer fragment 50 comprised of a bulk substrate region 52, field oxidation region 54 and a pair of word lines 56, 58 is first illustrated in FIG. 4. Word lines 56 and 58 are comprised of a gate oxide region 60, conductively doped polysilicon region 62, a metal silicide layer 64 and a overlying oxide cap 66. Layers 66, 64 and 62 have been patterned as shown to define word line outlines 56, 58. Word lines 56, 58 include opposing edges 65 of polysilicon material. Word lines 56 and 58 are patterned to define first region 68 for formation of first n-channel active areas for electrical connection with memory cell capacitor, and to define second region 70 for formation of second n-channel active areas for electrical connection with bit lines.

A punch-through p-type LDD halo implant is conducted through gate oxide layer 60 into first and second regions 68, 70 respectively to define implant region 72 for use in formation of LDD regions for the first and second n-channel active areas. An example dopant would be boron implanted at an energy of 50 KeV at a dose of $4 \times 10^{12}$ atoms/cm$^2$.

Figure 5:
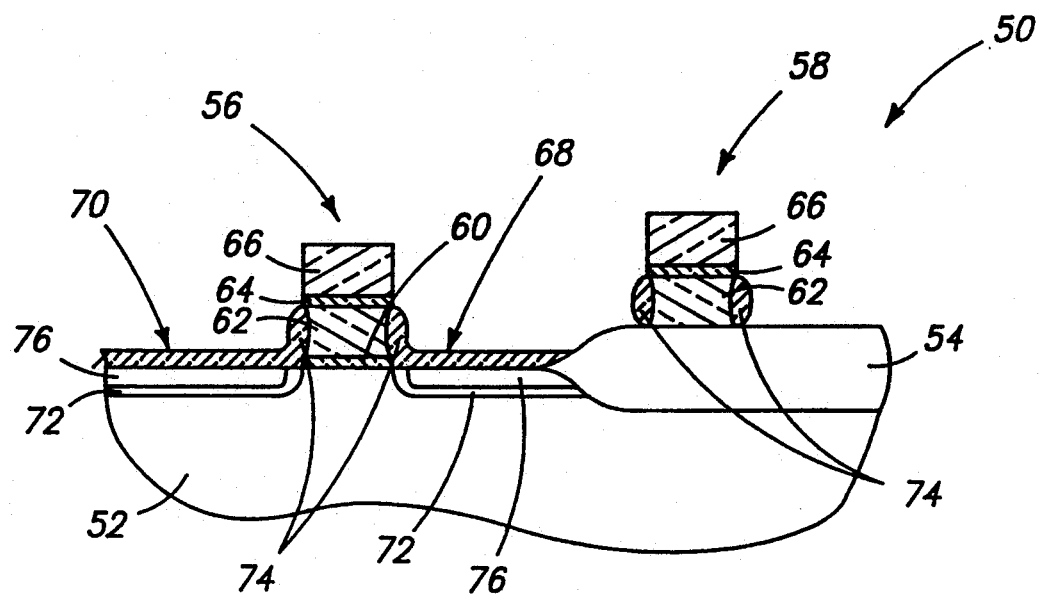
FIG. 5 is a view of the FIG. 4 wafer at a processing step subsequent to that shown by FIG. 4.

Referring to FIG. 5, wafer 50 is subjected to oxidizing conditions to oxidize outer opposing edges 65 of word line polysilicon to grow laterally projecting first word line oxide spacers 74. Such spacers preferably have a thickness of from about 500 Angstroms to about 1000 Angstroms, with about 750 Angstroms being most preferred. Example conditions for producing such 750 Angstrom thick spacers 74 would include using an oxidizing ambient H$_2$/O$_2$ gas at 900° C. for about 15 minutes. Such conditions also cause oxide to form or grow off the upper surface of the silicon of regions 68 and 70, causing oxide layer 60 to grow slightly in these areas, as shown. After such first spacer formation, an n-LDD implant is conducted into first and second regions 68, 70 respectively to define implant regions 76. An example deposition would be to provide a phosphorus dopant at 100 KeV at a dose of $1.5 \times 10^{13}$ atoms/cm$^2$.

Figure 6:
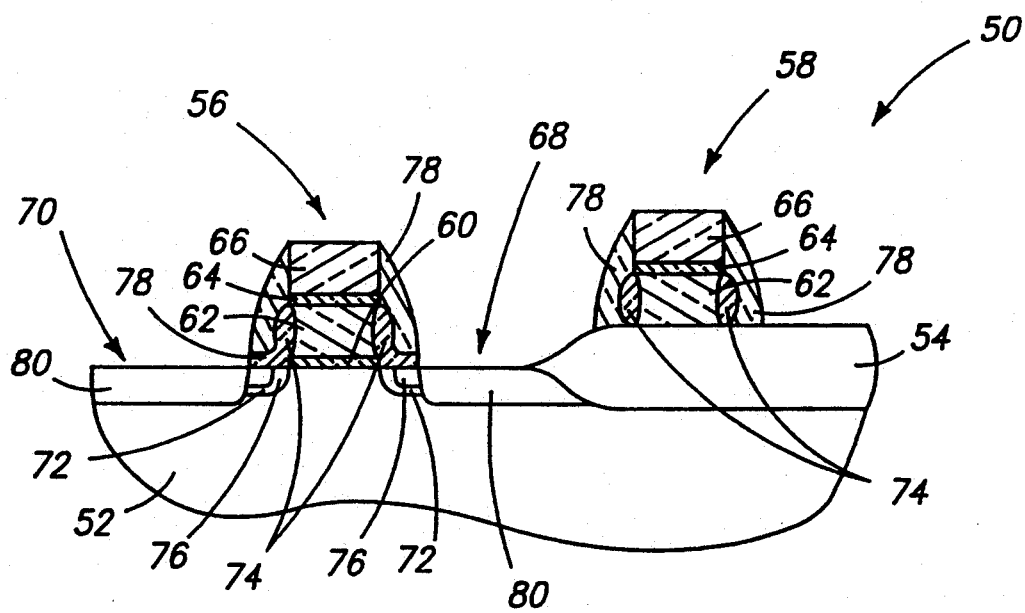
FIG. 6 is a view of the FIG. 4 wafer at a processing step subsequent to that shown by FIG. 5.

Referring to FIG. 6, a layer of insulating material is deposited to a selected thickness over word lines 56, 58 and second LDD implanted first and second regions 68, 70. Such layer is anisotropically etched to define second word line spacers 78. Preferably, the thickness of the layer deposited to produce spacer 78 is provided to from about 2000 Angstroms to about 4000 Angstroms, with about 3000 Angstroms being most preferred. The typical and preferred etch for producing spacers 78 is a dry reactive ion etch. During such etch or thereafter, any remaining insulating material including gate oxide layer 60 is etched to upwardly expose first and second regions 68, 70, respectively. Thereafter, an n+ implant is conducted into first and second regions 68, 70, respectively, to define n+ active regions 80. At this point in the process, an array of electrically insulated word lines are essentially provided atop a semiconductor substrate having adjacent first and second active regions.

Figure 7:
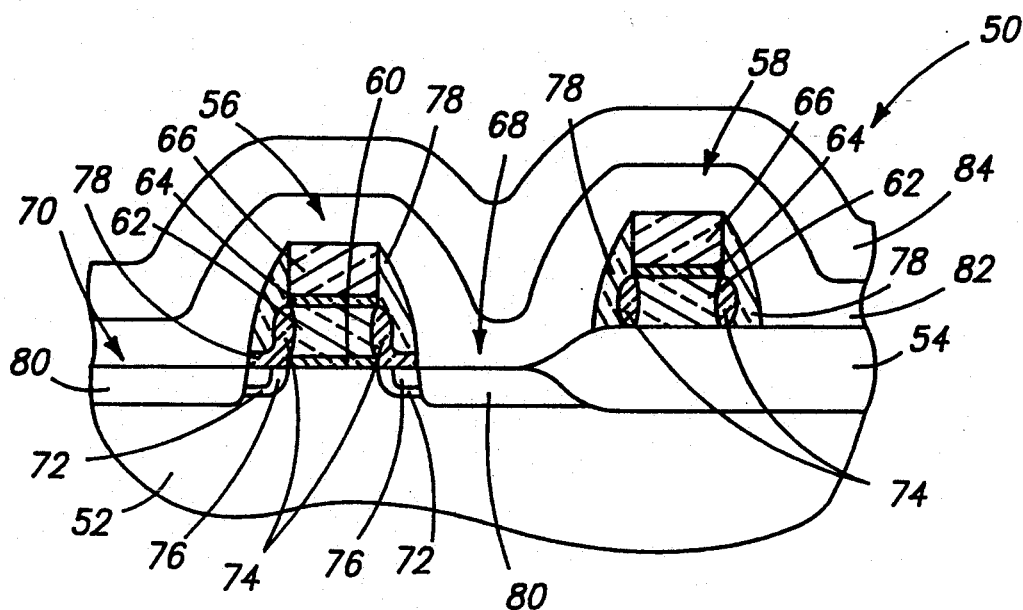
FIG. 7 is a view of the FIG. 4 wafer at a processing step subsequent to that shown by FIG. 6.

Referring to FIG. 7, a layer 82 of first conductive material is provided atop the wafer to a thickness of at least about 1500 Angstroms and preferably less than about 2000 Angstroms to conductively connect with first active region 68. Most preferably, the thickness of layer 82 is about 1750 Angstroms. The first conductive material of layer 82 is selectively etchable relative to silicon with silicon being selectively etchable relative to the first conductive material. Preferably, the first conductive material comprises a transition metal silicide or a transition metal nitride. Example transition metals include W, Mo, Ta, Ti, Pa, Pt, Ni and Co. An example most preferred material comprises titanium nitride.

Thereafter, a layer 84 of storage node polysilicon is deposited atop layer 82, and is conductively doped with a conductivity enhancing impurity to conductively connect storage node polysilicon with layer 82 of first conductive material. To prevent any tendency of the preferred nitride material of layer 82 from converting to a metal silicide because of the present of poly, polysilicon layer 84 is preferably deposited at a lower than conventional temperature, such as at a temperature of less than or equal to about 550° C. During such doping, layer 82 of first conductive material acts as a diffusion barrier to prevent migration of the conductivity enhancing impurity into first and second active regions 68, 70. Such migration is undesirable because the n-type dopant will migrate under the n-channel gate such that sub-threshold voltage characteristics will be greatly degraded, and the threshold voltage will also be inherently lower.

Figure 8:
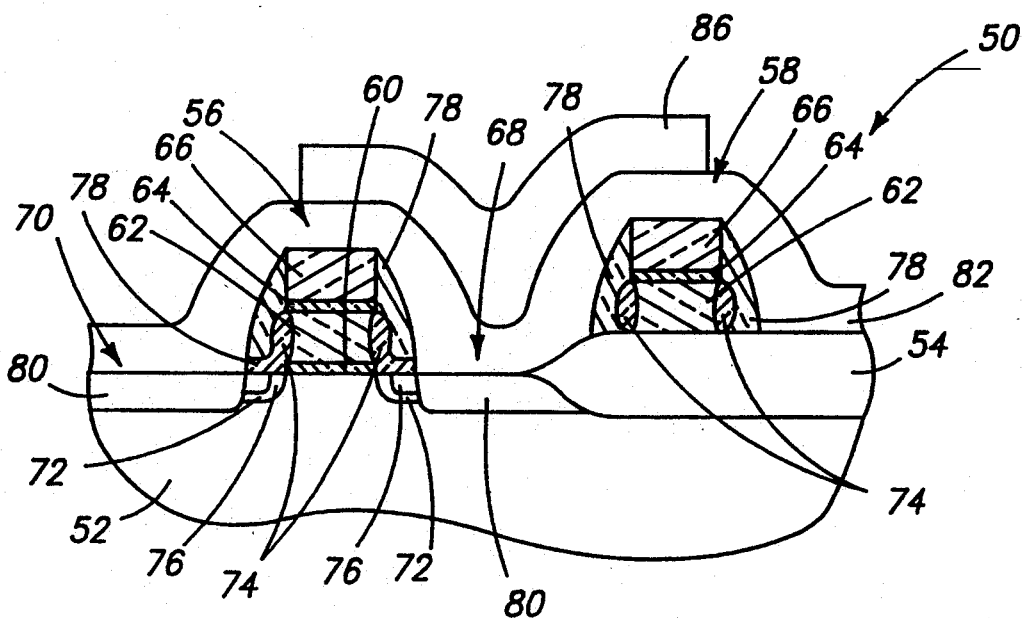
FIG. 8 is a view of the FIG. 4 wafer at a processing step subsequent to that shown by FIG. 7.

Referring to FIG. 8, polysilicon layer 84 has been patterned and selectively etched relative to layer 82 to define isolated capacitor storage nodes 86. Example etching conditions would include an RIE polysilicon etch with either $NF_3$, HBr, $SF_6$ chemistries, or a wet polysilicon etch comprised of $HF/HNO_3/H_2O$, with layer 82 acting as an effective wet etch stop. Note also that at this point through the process, storage nodes 86 have been defined and patterned without any previous capacitor buried contact photolithography masking.

Figure 9:
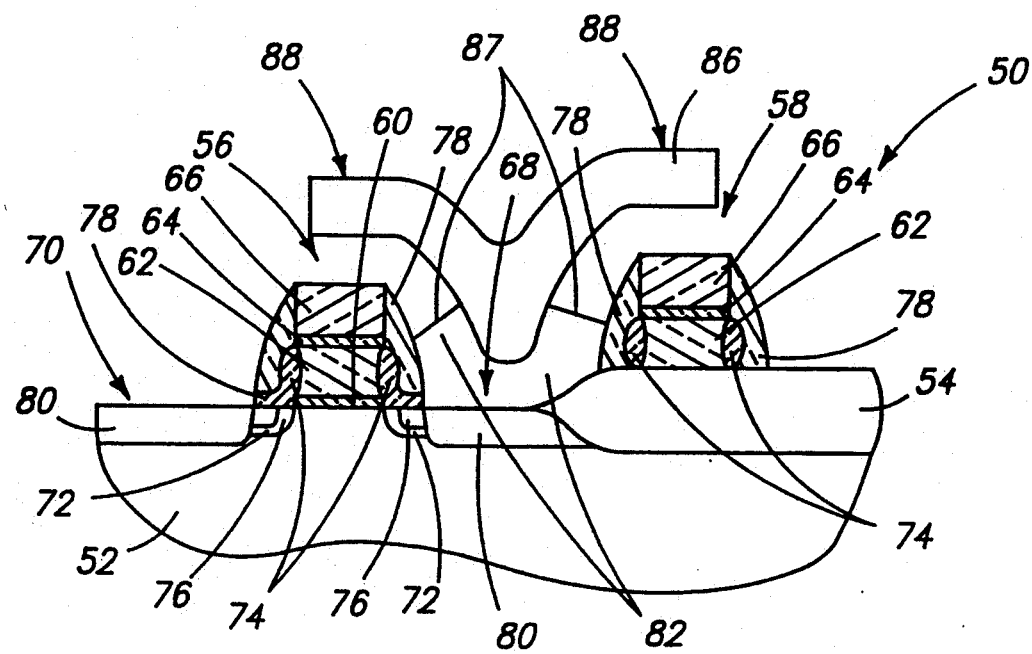
FIG. 9 is a view of the FIG. 4 wafer at a processing step subsequent to that shown by FIG. 8.

Referring to FIG. 9, first conductive material of layer 82 is selectively undercut etched relative to storage node polysilicon 86 to expose bottom portions of the storage nodes 86 above word lines 56 and 58. An example wet etch would utilize sulfuric acid and hydrogen peroxide. This thereby defines a pair of opposing storage node capacitor fins 88 projecting laterally above adjacent word lines. For purposes of the continuing discussion, etched layer 82 has opposed outer lateral edges 87.

Figure 10:
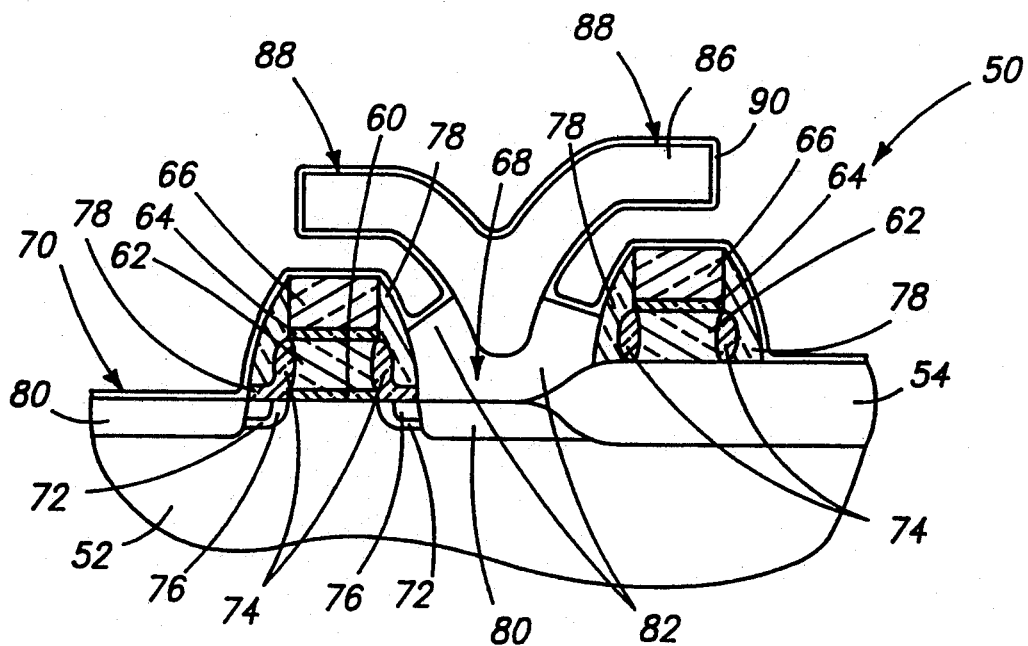
FIG. 10 is a view of the FIG. 4 wafer at a processing step subsequent to that shown by FIG. 9.

Referring to FIG. 10, an optional layer 90 of conductive cell polysilicon having a thickness of less than or equal to about 100 Angstroms can be provided atop the wafer at this point. Layer 90 may be desirable to prevent reaction of a subsequently deposited capacitor dielectric layer with the titanium of the preferred titanium nitride material of layer 82 the result of exposed outer lateral edges 87.

Figure 11:
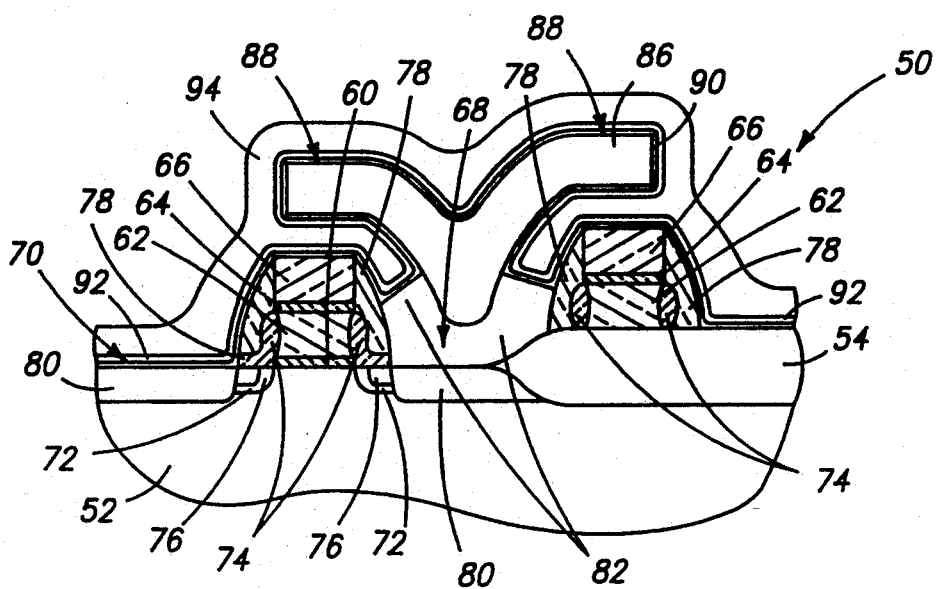
FIG. 11 is a view of the FIG. 4 wafer at a processing step subsequent to that shown by FIG. 10.

Referring to FIG. 11, a layer 92 of capacitor dielectric is conformally deposited atop finned isolated capacitor storage nodes 88. A preferred material is $Si_3N_4$ which is subjected to conventional wet anneal to produce an ONO capacitor dielectric composition. Thereafter, a layer 94 of electrically conductive cell polysilicon is provided atop capacitor dielectric layer 92.

Figure 12:
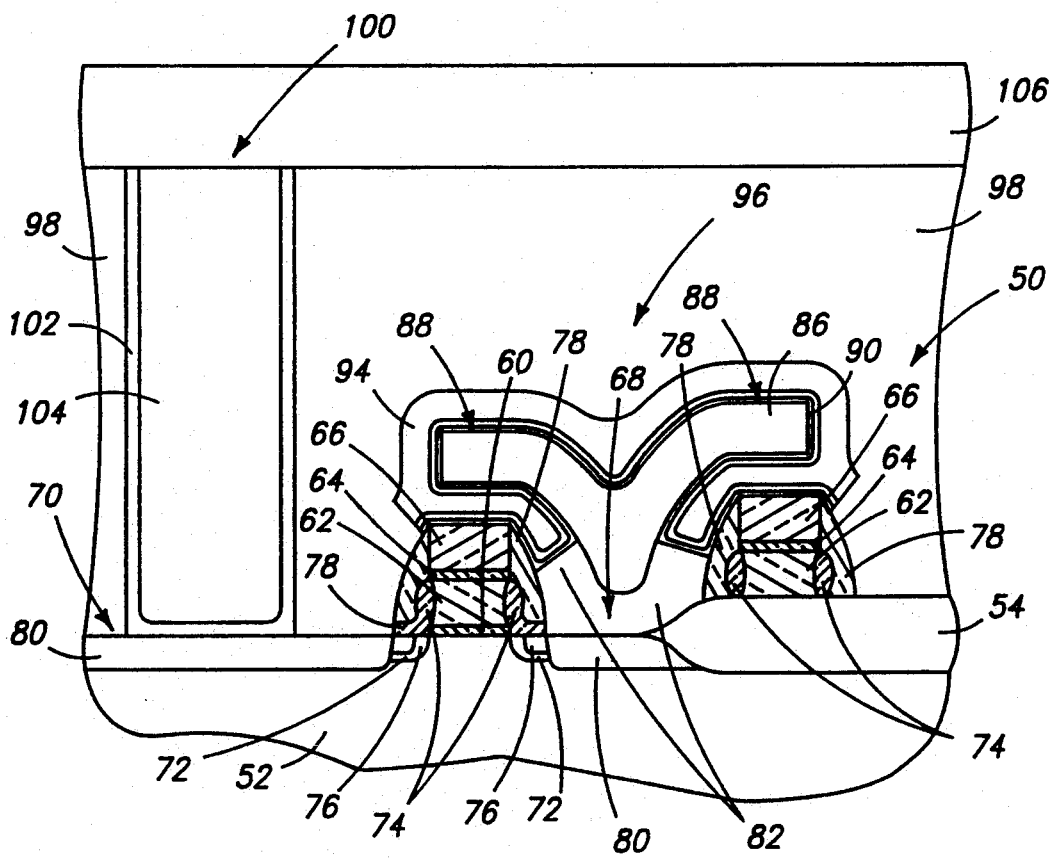
FIG. 12 is a view of the FIG. 4 wafer at a processing step subsequent to that shown by FIG. 11.

Referring to FIG. 12, cell poly layer 94 and capacitor dielectric layer 92 are preferably patterned to produce the illustrated capacitor construction 96. Thereafter, a layer 98 of insulating dielectric is deposited atop the wafer, and etched to provide a contact opening 100 to second active area 70. A thin conductive layer 102, such as TiN, is provided atop the wafer within contact opening 100. Subsequently, a layer and corresponding plug of conductive tungsten 104 provided within contact opening 100. Thereafter, a metal layer 106 is provided atop the wafer and patterned to define bit lines which electrically connect with second active regions 70 through bit line plug 104 and conductive liner 102.

Oxidizing the side walls of polysilicon word lines 58, 60 as opposed to depositing a layer of silicon dioxide and subsequently anisotropically etching, saves a mask step. Further, oxidized portions 74 project laterally relative to the word lines a lesser distance than spacers provided by layering and anisotropic etching. Additionally, the TiN interposed between storage node polysilicon 84 and active area 80 provides an effective conductive diffusion barrier to prevent conductivity enhancing impurity from migrating into the active area. The above-described process also eliminates a conventional buried contact mask. Such further reduces the required masking steps by one.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming finned memory cell capacitors comprising the following steps:
   providing an array of electrically insulated word lines atop a semiconductor wafer;
   defining first active regions adjacent the word lines for connection with memory cell capacitors;
   defining second active regions adjacent the word lines for electrical connection with bit lines;
   etching to upwardly expose the first active regions;
   providing a layer of first conductive material atop the wafer to a thickness of at least about 1500 Angstroms to conductively connect with the first active regions, the first conductive material being selectively etchable relative to silicon with silicon being selectively etchable relative to the first conductive material;
   depositing a later of storage node polysilicon atop the layer of first conductive material;
   conductively doping storage node polysilicon with a conductivity enhancing impurity to conductively connect the storage node polysilicon with the layer of first conductive material, the layer of first conductive material during such doping acting as a diffusion barrier to prevent migration of the impurity into the first active regions;
   etching the storage node polysilicon layer selectively relative to the first conductive material to define isolated capacitor storage nodes;
   selectively undercut etching the layer of first conductive material selectively relative to the storage node polysilicon to expose bottom portions of the storage nodes above the electrically insulated word lines and thereby define capacitor fins;
   conformally depositing a layer of capacitor dielectric atop the finned isolated capacitor storage nodes; and
   providing a layer of electrically conductive cell polysilicon atop the capacitor dielectric layer.

2. The method of forming finned memory cell capacitors of claim 1 wherein the first conductive material comprises a transition metal silicide or a transition metal nitride.

3. The method of forming finned memory cell capacitors of claim 1 wherein the first conductive material comprises TiN.

4. The method of forming finned memory cell capacitor of claim 1 wherein the thickness of the first conductive material is less than about 2000 Angstroms.

5. The method of forming finned memory cell capacitors of claim 1 wherein the thickness of the first conductive material is about 1750 Angstroms.

6. The method of forming finned memory cell capacitors of claim 1 wherein the first conductive material comprises a transition metal silicide or a transition metal nitride, and the thickness of the first conductive material is less than about 2000 Angstroms.

7. The method of forming finned memory cell capacitors of claim 1 wherein the first conductive material comprises TiN, and the thickness of the first conductive material is less than about 2000 Angstroms.

8. The method of forming finned memory cell capacitors of claim 1 wherein the step of depositing the layer of storage node polysilicon comprises depositing polysilicon at a temperature of less than or equal to about 550° C.

9. The method of forming finned memory cell capacitors of claim 1 further comprising providing a conformal layer of conductive cell polysilicon to a thickness of less than or equal to about 100 Angstroms over the finned isolated storage nodes prior to depositing the capacitor dielectric layer.

10. A method of forming finned memory cell capacitors over n-channel transistors comprising the following steps:

providing an array of word lines atop a semiconductor wafer, and defining first regions adjacent the word lines for formation of first n-channel active areas for electrical connection with memory cell capacitors, and defining second regions adjacent the word lines for formation of second n-channel active areas for electrical connection with bit lines, the word lines comprising conductively doped polysilicon, outer opposing edges of polysilicon of the word lines being exposed to the first and second regions;

conducting an LDD halo implant into the first and second regions for use in formation of LDD regions for the first and second n-channel active areas;

oxidizing the outer opposing edges of the word line polysilicon to grow laterally projecting first word line oxide spacers;

after first spacer formation, conducting a second LDD implant into the first and second regions;

depositing a layer of insulating material to a selected thickness over the word lines and second LDD implanted first and second regions;

etching the layer of insulating material to define second word line spacers over the first word line spacers;

etching the layer of material to upwardly expose the first and second regions;

conducting an n+ implant into the first and second regions;

providing a layer of first conductive material atop the wafer to a thickness of at least about 1500 Angstroms to conductively connect with the first active regions, the first conductive material being selectively etchable relative to silicon with silicon being selectively etchable relative to the first conductive material;

depositing a layer of storage node polysilicon atop the layer of first conductive material;

conductively doping storage node polysilicon with a conductivity enhancing impurity to conductively connect the storage node polysilicon with the layer of first conductive material, the layer of first conductive material during such doping acting as a diffusion barrier to prevent migration of the impurity into the first active regions;

etching the storage node polysilicon layer selectively relative to the first conductive material to define isolated capacitor storage nodes;

selectively undercut etching the layer of first conductive material selectively relative to the storage node polysilicon to expose bottom portions of the storage nodes above the work lines and thereby define capacitor fins;

conformally depositing a layer of capacitor dielectric atop the finned isolated capacitor storage nodes; and providing a layer of electrically conductive cell polysilicon atop the capacitor dielectric layer.

11. The method of forming finned memory cell capacitors of claim 10 wherein the first conductive material comprises a transition metal silicide or a transition metal nitride.

12. The method of forming finned memory cell capacitors of claim 10 wherein the first conductive material comprises TiN.

13. The method of forming finned memory cell capacitors of claim 10 wherein the thickness of the first conductive material is less than about 2000 Angstroms.

14. The method of forming finned memory cell capacitors of claim 10 wherein the thickness of the first conductive material is about 1750 Angstroms.

15. The method of forming finned memory cell capacitors of claim 10 wherein the first conductive material comprises a transition metal silicide or a transition metal nitride, and the thickness of the first conductive material is less than about 2000 Angstroms.

16. The method of forming finned memory cell capacitors of claim 10 wherein the first conductive material comprises TiN, and the thickness of the first conductive material is less than about 2000 Angstroms.

17. The method of forming finned memory cell capacitors of claim 10 wherein the step of depositing the layer of storage node polysilicon comprises depositing polysilicon at a temperature of less than or equal to about 550° C.

18. The method of forming finned memory cell capacitors of claim further comprising providing a conformal layer of conductive cell polysilicon to a thickness of less than or equal to about 100 Angstroms over the finned isolated storage nodes prior to depositing the capacitor dielectric layer.

19. The method of forming finned memory cell capacitors of claim 10 wherein the outer opposing edges of the word line polysilicon are oxidized to produce first word line spacers having a thickness of from about 500 Angstroms to about 1000 Angstroms.

20. The method of forming finned memory cell capacitors of claim 10 wherein the selected thickness of the insulating material layer is from about 2000 Angstroms to about 4000 Angstroms.

* * * * *